United States Patent
Erdogan et al.

(10) Patent No.: US 9,846,186 B2
(45) Date of Patent: *Dec. 19, 2017

(54) CAPACITIVE TOUCH SENSE ARCHITECTURE HAVING A CORRELATOR FOR DEMODULATING A MEASURED CAPACITANCE FROM AN EXCITATION SIGNAL

(71) Applicant: Qualcomm Incorporated, San Diego, CA (US)

(72) Inventors: Ozan E. Erdogan, Saratoga, CA (US); Guozhong Shen, San Jose, CA (US); Rajesh Anantharaman, San Jose, CA (US); Ajay Taparia, San Jose, CA (US); Behrooz Javid, Irvine, CA (US); Syed T. Mahmud, Dublin, CA (US); Rahim F. Chowdhury, Saratoga, CA (US)

(73) Assignee: QUALCOMM Incorporated, San Diego, CA (US)

( * ) Notice: Subject to any disclaimer, the term of this patent is extended or adjusted under 35 U.S.C. 154(b) by 134 days.

This patent is subject to a terminal disclaimer.

(21) Appl. No.: 14/530,889

(22) Filed: Nov. 3, 2014

(65) Prior Publication Data
US 2015/0048851 A1    Feb. 19, 2015

Related U.S. Application Data

(63) Continuation of application No. 13/403,873, filed on Feb. 23, 2012, now Pat. No. 8,878,797.
(Continued)

(51) Int. Cl.
*G06F 3/044*    (2006.01)
*G01R 27/26*    (2006.01)
*G06F 3/041*    (2006.01)

(52) U.S. Cl.
CPC ......... *G01R 27/2605* (2013.01); *G06F 3/044* (2013.01); *G06F 3/0416* (2013.01)

(58) Field of Classification Search
CPC ....................................................... G06F 3/044
See application file for complete search history.

(56) References Cited

U.S. PATENT DOCUMENTS

| 4,350,039 A | 9/1982 | Van Dyke et al. |
| 4,567,465 A | 1/1986 | Komiya |

(Continued)

FOREIGN PATENT DOCUMENTS

| CN | 1255974 A | 6/2000 |
| CN | 101080689 A | 11/2007 |

(Continued)

OTHER PUBLICATIONS

U.S. Appl. No. 13/403,885, filed Jul. 16, 2015, Erdogan et al.
(Continued)

*Primary Examiner* — Gene W Lee
(74) *Attorney, Agent, or Firm* — Weaver Austin Villeneuve & Sampson LLP—QUAL

(57) ABSTRACT

An analog front end circuit utilizes coherent detection within a capacitance measurement application. The analog front end circuit uses coherent detection to measure capacitance of a touch screen display. An analog excitation signal is modulated by a capacitor to be measured. The modulated signal is synchronously demodulated using a correlator, which includes a discrete mixer and a discrete integrator. The excitation signal is also input to the mixer such that the modulated signal is multiplied by the excitation signal. The excitation signal is an analog signal having a sine wave function or other waveform.

12 Claims, 4 Drawing Sheets

Related U.S. Application Data

(60) Provisional application No. 61/446,944, filed on Feb. 25, 2011.

(56) References Cited

U.S. PATENT DOCUMENTS

| | | | |
|---|---|---|---|
| 4,584,568 A | 4/1986 | Zomorrodi | |
| 4,764,717 A | 8/1988 | Tucker et al. | |
| 4,816,745 A | 3/1989 | Schneider | |
| 4,908,623 A | 3/1990 | Ullestad | |
| 4,939,520 A | 7/1990 | Biglow | |
| 4,949,398 A | 8/1990 | Maas | |
| 4,999,632 A | 3/1991 | Parks | |
| 5,321,403 A | 6/1994 | Eng, Jr. et al. | |
| 5,329,316 A | 7/1994 | Kang | |
| 5,781,044 A * | 7/1998 | Riley | H03L 7/1974 327/105 |
| 5,799,248 A | 8/1998 | Vice | |
| 5,982,221 A | 11/1999 | Tuthill | |
| 6,031,217 A | 2/2000 | Aswell et al. | |
| 6,043,943 A | 3/2000 | Rezzi et al. | |
| 6,285,310 B1 | 9/2001 | Michaelis et al. | |
| 6,433,713 B1 | 8/2002 | Fuhrman | |
| 6,493,404 B1 | 12/2002 | Iizuka et al. | |
| 7,206,062 B2 | 4/2007 | Asbrock et al. | |
| 7,221,534 B2 | 5/2007 | Anderson et al. | |
| 7,482,870 B2 | 1/2009 | Maejima et al. | |
| 7,643,011 B2 | 1/2010 | O'Connor et al. | |
| 7,692,638 B2 | 4/2010 | Land et al. | |
| 7,808,255 B2 | 10/2010 | Hristov et al. | |
| 7,821,274 B2 | 10/2010 | Philipp et al. | |
| 7,821,502 B2 | 10/2010 | Hristov | |
| 7,864,160 B2 | 1/2011 | Geaghan et al. | |
| 7,877,076 B2 | 1/2011 | Walkington | |
| 7,898,329 B1 | 3/2011 | Clara et al. | |
| 7,907,020 B2 | 3/2011 | Wilson | |
| 7,920,134 B2 | 4/2011 | Krah | |
| 7,932,898 B2 | 4/2011 | Philipp et al. | |
| 7,986,313 B2 | 7/2011 | Krah | |
| 8,026,904 B2 | 9/2011 | Westerman | |
| 8,031,094 B2 | 10/2011 | Hotelling et al. | |
| 8,035,622 B2 | 10/2011 | Hotelling et al. | |
| 8,054,296 B2 | 11/2011 | Land et al. | |
| 8,077,160 B2 | 12/2011 | Land et al. | |
| 8,085,247 B2 | 12/2011 | Wilson | |
| 8,094,128 B2 | 1/2012 | Vu et al. | |
| 8,098,219 B2 | 1/2012 | Kim | |
| 8,111,097 B1 | 2/2012 | Kutz et al. | |
| 8,125,456 B2 | 2/2012 | Krah et al. | |
| 8,232,970 B2 | 7/2012 | Krah et al. | |
| 8,278,571 B2 | 10/2012 | Orsley | |
| 8,310,472 B2 | 11/2012 | Vu et al. | |
| 8,354,991 B2 | 1/2013 | Brown et al. | |
| 8,390,588 B2 | 3/2013 | Vu et al. | |
| 8,441,462 B2 | 5/2013 | Kobayashi et al. | |
| 8,471,837 B2 | 6/2013 | Vu et al. | |
| 8,493,330 B2 | 7/2013 | Krah | |
| 8,575,988 B2 | 11/2013 | Erdogan et al. | |
| 8,643,619 B2 | 2/2014 | Erdogan et al. | |
| 8,659,343 B2 | 2/2014 | Erdogan et al. | |
| 8,836,666 B2 | 9/2014 | Brosnan | |
| 8,860,432 B2 | 10/2014 | Shen et al. | |
| 8,878,797 B2 | 11/2014 | Erdogan et al. | |
| 9,086,439 B2 | 7/2015 | Erdogan et al. | |
| 9,552,102 B2 | 1/2017 | Shen et al. | |
| 9,625,507 B2 | 4/2017 | Erdogan et al. | |
| 2002/0011991 A1 | 1/2002 | Iwasaki et al. | |
| 2002/0072770 A1 | 6/2002 | Pless | |
| 2002/0077670 A1 | 6/2002 | Archer et al. | |
| 2003/0184356 A1 | 10/2003 | Wang et al. | |
| 2005/0052299 A1 | 3/2005 | Oliaei | |
| 2005/0104756 A1 | 5/2005 | Tazartes et al. | |
| 2005/0164669 A1 | 7/2005 | Molnar et al. | |
| 2005/0266817 A1 | 12/2005 | Welland et al. | |
| 2005/0275026 A1 | 12/2005 | Tsividis et al. | |
| 2006/0141976 A1 | 6/2006 | Rohde et al. | |
| 2006/0194560 A1 | 8/2006 | Shu | |
| 2007/0091053 A1 | 4/2007 | Kajiwara et al. | |
| 2007/0257890 A1 | 11/2007 | Hotelling et al. | |
| 2007/0268272 A1 | 11/2007 | Perski et al. | |
| 2008/0048997 A1 | 2/2008 | Gillespie et al. | |
| 2008/0157782 A1 | 7/2008 | Krah | |
| 2008/0157867 A1 | 7/2008 | Krah | |
| 2008/0158172 A1 | 7/2008 | Hotelling et al. | |
| 2008/0158174 A1 | 7/2008 | Land et al. | |
| 2008/0158178 A1 | 7/2008 | Hotelling et al. | |
| 2008/0158179 A1 | 7/2008 | Wilson | |
| 2008/0158180 A1 | 7/2008 | Krah et al. | |
| 2008/0158182 A1 | 7/2008 | Westerman | |
| 2008/0158184 A1 | 7/2008 | Land et al. | |
| 2008/0162996 A1 | 7/2008 | Krah et al. | |
| 2008/0162997 A1 | 7/2008 | Vu et al. | |
| 2008/0252367 A1 | 10/2008 | Pettersen et al. | |
| 2008/0297487 A1 | 12/2008 | Hotelling et al. | |
| 2008/0309622 A1 | 12/2008 | Krah | |
| 2008/0309625 A1 | 12/2008 | Krah et al. | |
| 2009/0058535 A1 | 3/2009 | Wilson | |
| 2009/0244014 A1 | 10/2009 | Hotelling et al. | |
| 2009/0251196 A1 | 10/2009 | Tsividis et al. | |
| 2009/0315850 A1 | 12/2009 | Hotelling et al. | |
| 2009/0315851 A1 | 12/2009 | Hotelling et al. | |
| 2009/0318095 A1 | 12/2009 | Shu | |
| 2009/0322351 A1 | 12/2009 | Mcleod | |
| 2010/0033240 A1 | 2/2010 | Denison et al. | |
| 2010/0044122 A1 | 2/2010 | Sleeman et al. | |
| 2010/0066473 A1 | 3/2010 | Fahs | |
| 2010/0110037 A1 | 5/2010 | Huang et al. | |
| 2010/0110040 A1 | 5/2010 | Kim et al. | |
| 2010/0156811 A1 | 6/2010 | Long et al. | |
| 2010/0156846 A1 | 6/2010 | Long et al. | |
| 2010/0164898 A1 | 7/2010 | Vu et al. | |
| 2010/0173680 A1 | 7/2010 | Vu et al. | |
| 2010/0188356 A1 | 7/2010 | Vu et al. | |
| 2010/0252335 A1 | 10/2010 | Orsley | |
| 2010/0258360 A1 | 10/2010 | Yilmaz | |
| 2011/0001492 A1 | 1/2011 | Nys et al. | |
| 2011/0012618 A1 | 1/2011 | Teterwak et al. | |
| 2011/0015889 A1 | 1/2011 | Land et al. | |
| 2011/0018626 A1 | 1/2011 | Kojima | |
| 2011/0025634 A1 | 2/2011 | Krah et al. | |
| 2011/0061949 A1 | 3/2011 | Krah et al. | |
| 2011/0095991 A1 | 4/2011 | Philipp et al. | |
| 2011/0122089 A1 | 5/2011 | Kobayashi et al. | |
| 2011/0147723 A1 | 6/2011 | Hodges et al. | |
| 2011/0193817 A1 | 8/2011 | Byun et al. | |
| 2011/0205181 A1 | 8/2011 | Nagata et al. | |
| 2011/0248723 A1 | 10/2011 | Yeh et al. | |
| 2011/0261005 A1 | 10/2011 | Joharapurkar et al. | |
| 2011/0273189 A1 | 11/2011 | Gerber | |
| 2011/0273399 A1 | 11/2011 | Lee | |
| 2012/0056841 A1 | 3/2012 | Krenik et al. | |
| 2012/0105353 A1 | 5/2012 | Brosnan | |
| 2012/0217978 A1 | 8/2012 | Shen et al. | |
| 2012/0217981 A1 | 8/2012 | Erdogan et al. | |
| 2012/0218020 A1 | 8/2012 | Erdogan et al. | |
| 2012/0218222 A1 | 8/2012 | Shen et al. | |
| 2012/0218223 A1 | 8/2012 | Erdogan et al. | |
| 2012/0274404 A1 | 11/2012 | Erdogan et al. | |
| 2012/0287077 A1 | 11/2012 | Pant et al. | |
| 2013/0069905 A1 | 3/2013 | Krah et al. | |
| 2013/0088245 A1 | 4/2013 | Sezginer | |
| 2013/0162586 A1 | 6/2013 | Erdogan et al. | |
| 2013/0207906 A1 | 8/2013 | Yousefpor et al. | |
| 2014/0152328 A1 | 6/2014 | Erdogan et al. | |
| 2015/0324061 A1 | 11/2015 | Shen et al. | |

FOREIGN PATENT DOCUMENTS

| | | |
|---|---|---|
| CN | 101339479 A | 1/2009 |
| CN | 101371564 A | 2/2009 |
| CN | 101438179 A | 5/2009 |
| CN | 101467119 A | 6/2009 |
| CN | 101479692 A | 7/2009 |
| CN | 101490567 A | 7/2009 |

(56) References Cited

FOREIGN PATENT DOCUMENTS

| | | |
|---|---|---|
| CN | 101568805 A | 10/2009 |
| CN | 101755219 A | 6/2010 |
| CN | 101833044 A | 9/2010 |
| CN | 101937297 A | 1/2011 |
| CN | 101957218 A | 1/2011 |
| JP | 3987294 B2 | 10/2007 |
| TW | 201017184 A | 5/2010 |
| WO | WO-9938019 | 7/1999 |
| WO | WO-2004051550 A1 | 6/2004 |
| WO | WO-2012148539 | 11/2012 |

OTHER PUBLICATIONS

"Fully Differential Op Amps Made Easy," Application Report SLOA099, Texas Instruments, May 2002.
International Search Report and Written Opinion—PCT/US2012/026397—ISA/EPO—May 29, 2012.
Kim H-R., et al., "A mobile-display-driver IC embedding a capacitive-touch-screen controller system," Solid-State Circuits Conference Digest of Technical Papers (ISSCC), 2010 IEEE International, vol., No., pp. 114,115, Feb. 7-11, 2010 doi: 10.1109/ISSCC.2010.5434080.
U.S. Office Action dated May 27, 2014, issued in U.S. Appl. No. 13/403,885.
U.S. Final Office Action dated Dec. 26, 2014, issued in U.S. Appl. No. 13/403,885.
U.S. Notice of Allowance dated Mar. 12, 2015, issued in U.S. Appl. No. 13/403,885.
U.S. Office Action dated Sep. 18, 2013, issued in U.S. Appl. No. 13/403,873.
U.S. Final Office Action dated Jan. 17, 2014, issued in U.S. Appl. No. 13/403,873.
U.S. Notice of Allowance dated Jul. 8, 2014, issued in U.S. Appl. No. 13/403,873.
U.S. Notice of Allowance dated Oct. 4, 2013, issued in U.S. Appl. No. 13/404,594.
U.S. Office Action dated Apr. 26, 2013, issued in U.S. Appl. No. 13/404,722.
U.S. Notice of Allowance dated Jul. 8, 2013, issued in U.S. Appl. No. 13/404,722.
U.S. Office Action dated Jul. 30, 2013, issued in U.S. Appl. No. 13/404,817.
U.S. Notice of Allowance dated Oct. 17, 2013, issued in U.S. Appl. No. 13/404,817.
U.S. Notice of Allowance (Supplemental Notice of Allowability) dated Dec. 10, 2013, issued in U.S. Appl. No. 13/404,817.
U.S. Office Action dated Feb. 14, 2014, issued in U.S. Appl. No. 13/401,995.
U.S. Notice of Allowance dated Jun. 11, 2014, issued in U.S. Appl. No. 13/401,995.
U.S. Office Action dated Apr. 15, 2015, issued in U.S. Appl. No. 14/512,512.
U.S. Office Action dated Oct. 23, 2013, issued in U.S. Appl. No. 13/402,485.
U.S. Final Office Action dated Feb. 21, 2014, issued in U.S. Appl. No. 13/402,485.
U.S. Office Action dated Jun. 17, 2014, issued in U.S. Appl. No. 13/402,485.
U.S. Final Office Action dated Oct. 21, 2014, issued in U.S. Appl. No. 13/402,485.
U.S. Office Action dated Mar. 6, 2015, issued in U.S. Appl. No. 13/402,485.
U.S. Final Office Action dated Jul. 17, 2015, issued in U.S. Appl. No. 13/402,485.
International Preliminary Report on Patentability and Written Opinion—PCT/US2012/026397—ISA/EPO—Sep. 6, 2013.
Chinese First Office Action and Search Report dated May 18, 2015 issued in CN201210103158.2.
U.S. Office Action dated May 3, 2016, issued in U.S. Appl. No. 14/172,158.
U.S. Final Office Action dated Oct. 6, 2016, issued in U.S. Appl. No. 14/172,158.
U.S. Final Office Action dated Dec. 31, 2015, issued in U.S. Appl. No. 14/512,512.
U.S. Notice of Allowance dated Sep. 26, 2016, issued in U.S. Appl. No. 14/512,512.
U.S. Notice of Allowance dated Nov. 16, 2016, issued in U.S. Appl. No. 14/512,512.
U.S. Notice of Allowance dated Apr. 27, 2016, issued in U.S. Appl. No. 14/512,512.
U.S. Notice of Allowance dated Dec. 21, 2016, issued in U.S. Appl. No. 14/172,158.
U.S. Appl. No. 15/476,745, filed Mar. 31, 2017, Erdogan et al.
U.S. Office Action dated May 5, 2017, issued in U.S. Appl. No. 15/476,745.

* cited by examiner

US 9,846,186 B2

CAPACITIVE TOUCH SENSE ARCHITECTURE HAVING A CORRELATOR FOR DEMODULATING A MEASURED CAPACITANCE FROM AN EXCITATION SIGNAL

RELATED APPLICATIONS

This application is a continuation of U. S. patent application Ser. No. 13/403,873, filed Feb. 23, 2012, now U.S. Pat. No. 8,878,797 and entitled "CAPACITIVE TOUCH SENSE ARCHITECTURE HAVING A CORRELATOR FOR DEMODULATING A MEASURED CAPACITANCE FROM AN EXCITATION SIGNAL", and claims the priority benefit of U.S. provisional application, Ser. No. 61/446,944, filed Feb. 25, 2011, and entitled "Mutual Capacitance Touch-Screen Controller IIC Interface", the these same inventors. This application incorporates U.S. provisional application, Ser. No. 61/446,994 in its entirety by reference the disclosures of which are hereby incorporated by reference into the present application in their entireties.

FIELD OF THE INVENTION

This invention relates to analog front end circuits for converting measured capacitances to voltages. More specifically, this invention relates to analog front end circuits having a correlator for demodulating a measured capacitance from an excitation signal.

BACKGROUND OF THE INVENTION

Many electrical devices are incorporating touchscreen type displays. A touchscreen is a display that detects the presence, location, and pressure of a touch within the display area, generally by a finger, hand, stylus, or other pointing device. The touchscreen enables a user to interact with the display panel directly without requiring any intermediate device, rather than indirectly with a mouse or touchpad. Touchscreens can be implemented in computers or as terminals to access networks. Touchscreens are commonly found in point-of-sale systems, automated teller machines (ATMs), mobile phones, personal digital assistants (PDAs), portable game consoles, satellite navigation devices, and information appliances.

There are a number of types of touchscreen technologies. A resistive touchscreen panel is composed of several layers including two thin metallic electrically conductive and resistive layers separated by thin space. When some object touches the touchscreen panel, the layers are connected at certain point. In response to the object contact, the panel electrically acts similar to two voltage dividers with connected outputs. This causes a change in the electrical current that is registered as a touch event and sent to the controller for processing.

A capacitive touchscreen panel is coated, partially coated, or patterned with a material that conducts a continuous electrical current across a sensor. The sensor exhibits a precisely controlled field of stored electrons in both the horizontal and vertical axes to achieve capacitance. The human body is conductive; therefore, influences electric fields stored in a capacitance. When a reference capacitance of the sensor is altered by another capacitance field, such as a finger, electronic circuits located at each corner of the panel measure the resultant distortion in the reference capacitance. The measured information related to the touch event is sent to the controller for mathematical processing.

Capacitive sensors can either be touched with a bare finger or with a conductive device being held by a bare hand. Capacitive sensors also work based on proximity, and do not have to be directly touched to be triggered. In most cases, direct contact to a conductive metal surface does not occur and the conductive sensor is separated from the user's body by an insulating glass or plastic layer. Devices with capacitive buttons intended to be touched by a finger can often be triggered by quickly waving the palm of the hand close to the surface without touching.

FIG. 1 illustrates an exemplary conventional capacitive touch sensor used in a capacitive touchscreen panel. Such sensors are typically formed using transparent conductors, such as ITO (Iridium Tin Oxide) conductors, formed in layers. In the exemplary configuration of FIG. 1, bottom conductors form drive electrodes $X0$, $X1$, $X2$, $X3$, also referred to as drive lines, and top conductors form sense electrodes $Y0$, $Y1$, $Y2$, $Y3$, also referred to as sense lines. Each cross-point of a drive line and a sense line forms a capacitor having a measured capacitance Cm. The objective is to determine an estimate of a touch position on the capacitive touch sensor. When a finger, or other object that is grounded, is positioned on or proximate a cross-point of the sensor, there is a change in the measured capacitance Cm at that cross-point. The measured capacitance Cm is the capacitance between the sense line and the drive line at the cross-point. When the touch event occurs at the cross-point, a portion of the field lines between the sense line and the drive line are diverted to between the sense line and the finger. As such the measured capacitance Cm decreases during a touch event.

An analog front end (AFE) circuit performs signal processing on an analog signal and typically performs an analog-to-digital conversion. Analog front end circuits can be used in a variety of applications, including measuring and converting a capacitance to a corresponding voltage. FIGS. 2A and 2B illustrate a simplified schematic block diagram of a conventional analog front end circuit used for measuring a capacitance of an external capacitor and converting the measured capacitance to a corresponding voltage. In an exemplary application, the external capacitance is the charge stored in the capacitor Cm of FIG. 1. FIG. 2A illustrates the circuit in a first phase, and FIG. 2B illustrates the circuit in a second phase. During phase 1, charge to be measured is collected on the capacitor Cm. During phase 2, the charge stored on the capacitor Cm is transferred to the capacitor Cf and a corresponding voltage Vout is output.

Referring to FIG. 2A, the circuit includes the capacitor Cm, an operational amplifier 2, a switch 4, a feedback capacitor Cf, and a switch 6. A voltage at the negative input of the amplifier 2, and therefore at a first terminal of the capacitor Cm, is a virtual ground, Vvg. During phase 1, the switch 4 is connected to the reference voltage Vref, and the switch 6 is closed. Closing the switch 6 enables the capacitor Cf to completely discharge to a known zero state. The charge across the capacitor Cm is Vvg-Vref times the capacitance Cm.

During phase 2, the switch 4 is connected to ground, and the switch 6 is opened, as shown in FIG. 2B. With the switch 4 connected to ground the voltage across the capacitor Cm is zero, and all the charge on the capacitor Cm is transferred to the capacitor Cf. The output voltage Vout is a signal with amplitude dependent on the charge stored on the capacitor Cm and transferred to the capacitor Cf. The output voltage Vout can be input to an analog-to-digital converter (ADC), such as in FIG. 4, to be converted to a corresponding digital output value. Since the capacitor Cf was completely discharged during phase 1, the charge stored on capacitor Cf is determined entirely by the amount of charge transferred from the capacitor Cm. If the capacitor Cf is not completely discharged to a zero state during phase 1, then the capacitor Cf will retain the memory of its previous state.

The output voltage Vout=Vref*Cm/Cf+vn, where Vref is a known internal reference value, vn is the undesired noise measured by the system, and Cf is a known value. As such, the capacitance Cm can be determined from the known values Vref and Cf and the measured value Vout. The capacitance Cm is a varying capacitance and represents the capacitance to be measured, such as the measured capacitance of a touch screen display. As a finger touches the touch screen display, the capacitance changes, which is the external capacitance change being measured.

A problem with the circuit of FIGS. 2A and 2B relates to wide-band noise sampling. The circuit does not include any noise filtering, so any noise introduced into the system at the transition from phase 1 to phase 2 is included within the charge transferred to the capacitor Cf This noise is represented as the component "vn" in the output voltage Vout. So not only is the output voltage Vout a measure of the capacitance Cm, but also an instantaneous sampling of the noise. Further, the dynamic range of the ADC needs to be large enough to account for the increased magnitude of the output voltage Vout due to noise. The larger dynamic range results in an ADC that has a larger area and uses more power.

FIG. 3 illustrates exemplary response curves for the circuit of FIGS. 2A and 2B. The top curve shows a sampling clock corresponding to phase 1 and phase 2. When the sample clock is high, e.g. 1V, the circuit is in phase 1 (FIG. 1), and when the sample clock is low, e.g. 0V, the circuit is in phase 2 (FIG. 2). In an exemplary application, the input is sampled on the rising edge of the sampling clock. The moment that the switches 4 and 6 are changed from phase 2 to phase 1 the voltage Vout is sampled. As shown in the middle curve of FIG. 3, there is some noise on the input signal, but its average value is substantially constant. The sampled value is expected to be constant, such as 1V, but due to the noise the actual sampled output varies about the expected constant value depending on the instantaneous noise present at the sampling time. An example of this variation on the actual sampled output is shown in the bottom curve of FIG. 3. If the instantaneous noise is high, then the actual sampled output is greater than the expected constant value, such as the portions of the sampled output curve that are above 1V. If the instantaneous noise is low, then the actual sampled output is lower than the expected constant value, such as the portions of the sampled output curve that are below 1V.

In application, a threshold voltage for determining a change in capacitance, such as a touch event on a touch screen display, is increased to accommodate the variation in the sampled output. Increasing the threshold voltage reduces the sensitivity of the system. Using a threshold voltage that is too low to account for the noise variations results in false triggers.

Various alternative systems that measure a capacitance include considerations for the noise. FIG. 4 illustrates a simplified schematic block diagram of a conventional analog front end circuit using digital filtering. The circuit of FIG. 4 includes an analog-to-digital converter (ADC) connected to the output of the low-noise amplifier (LNA). Voltage input to the ADC is converted to a digital value, which is processed by digital processing circuitry that includes noise filtering. The ADC is also a sampling system which samples at a single instant in time. This results in similar varying sampled output values as described above in relation to FIG. 3.

FIG. 5 illustrates a simplified schematic block diagram of another conventional analog front end circuit. The circuit of FIG. 5 is the same as the circuit of FIG. 4 with the addition of a band-pass filter (BPF) to filter the signal prior to inputting to the ADC. The BPF attempts to filter the noise present in the voltage signal (middle curve of FIG. 3) prior to inputting to the ADC. Sampling is performed on the filtered signal output from the BPF. The problem with the circuit of FIG. 5 is that different applications are subjected to different noise spectrums. As such, the BPF cannot be fixed, instead the BPF must be tunable to the specific application. Also, the BPF should be able to be finely tuned to accommodate applications with a relatively narrow frequency response. For example, a touch screen display may have a frequency response between about 50-400 kHz. If the BPF has too large a bandwidth, such as 50 kHz, the filter bandwidth may be too wide to effectively filter noise for certain applications.

SUMMARY OF THE INVENTION

An analog front end circuit utilizes coherent detection within a capacitance measurement application. In some applications, the analog front end circuit uses coherent detection to measure capacitance of a touch screen display. The analog front end detection circuit includes a signal generator that generates an analog excitation signal. The analog excitation signal is modulated by a capacitor to be measured. The modulated signal is synchronously demodulated using a correlator. In some embodiments, the correlator includes a discrete mixer and a discrete integrator. The excitation signal is also input to the mixer such that the modulated signal is multiplied by the excitation signal. In some embodiments, the excitation signal is an analog signal having a sine wave function. In other embodiments, other waveforms can be used other than a sine wave. In general, an excitation signal is generated and modulated by the capacitor to be measured, and a correlation signal is mixed with the modulated signal and integrated over a discrete period of time. The correlation signal is correlated to the excitation signal.

In an aspect, a capacitance measurement circuit includes an external capacitor and a coherent detection circuit coupled to the external capacitor. The coherent detection circuit is configured to measure a capacitance of the external capacitor and to convert the measured capacitance to a corresponding voltage output. The coherent detection circuit can include a discrete mixing circuit and a discrete integration circuit. The coherent detection circuit can also include a signal generator coupled to the external capacitor, wherein the signal generator is configured to generate an analog excitation signal. The coherent detection circuit can also include an amplifier and a feedback capacitor coupled to an input and to an output of the amplifier, wherein the input of the amplifier is coupled to the external capacitor and the output of the amplifier is coupled to the mixing circuit. A modulated analog excitation signal can be input to a first input of the mixing circuit, wherein the modulated analog signal includes the analog excitation signal modulated by a capacitance of the external capacitor. The analog excitation signal generated by the signal generator can also be input to a second input of the mixing circuit, wherein the mixing circuit is configured to multiply the modulated analog excitation signal and the analog excitation signal and to output a mixed analog signal. In some embodiments, a phase delay may be introduced into the mixing analog signal. The integration circuit can be configured to receive the mixed analog signal and to integrate the mixed analog signal over a discrete period of time to output the corresponding voltage output. The period of time can be a multiple of 1/f, where f is a frequency of the analog excitation signal.

The mixing circuit can be a continuous time mixing circuit, and the integration circuit can be a continuous time integration circuit. The coherent detection circuit can be a continuous time signal path, wherein the continuous time signal path is configured to receive a modulated analog signal from the external capacitor and convert the modulated analog signal to the corresponding voltage output. The capacitance measurement circuit can also include a touch screen display, wherein the touch screen display includes the external capacitor. The coherent detection circuit can be an analog synchronous demodulator.

In another aspect, a capacitance measurement circuit includes a signal generator, a touch screen display, an amplifier, a feedback capacitor, a mixing circuit, and an integration circuit. The signal generator is configured to generate an analog excitation signal. The touch screen display has at least one capacitor, wherein the capacitor is configured to input the analog excitation signal and to output a modulated analog excitation signal, wherein the analog excitation signal is modulated according to a capacitance of the capacitor. The amplifier is coupled to the capacitor and the feedback capacitor coupled to an input and to an output of the amplifier. The amplifier is configured to input the modulated analog excitation signal and to output an amplified modulated analog excitation signal. The mixing circuit is coupled to the amplifier and to the signal generator, wherein the mixing circuit is configured to input the amplified modulated analog excitation signal and an analog correlation signal that is correlated to the analog excitation signal, and to output a mixed analog signal. The integration circuit is coupled to the mixing circuit, wherein the integration circuit is configured to receive the mixed analog signal and to integrate the mixed analog signal over a discrete period of time to output a voltage signal, wherein the voltage signal corresponds to the capacitance of the capacitor.

In yet another aspect, a method of measuring capacitance is disclosed. The method includes generating an analog excitation signal. The method also includes applying the analog excitation signal to a capacitor to be measured, thereby modulating the analog excitation signal. The method also includes correlating the modulated analog excitation signal to a correlation signal to demodulate the modulated analog excitation signal resulting in an output voltage corresponding to a capacitance of the capacitor, wherein the correlation signal is correlated to the analog excitation signal. Correlating the modulated analog excitation signal to the correlation signal can include mixing the modulated analog excitation signal with the correlation signal resulting in a mixed analog signal, and integrating the mixed analog signal over a period of time resulting in the output voltage. The output voltage can be a DC voltage. Correlating the modulated analog excitation signal to the correlation signal filters noise and interference from the modulated analog excitation signal. The capacitor can measure a capacitance of a touch screen display.

BRIEF DESCRIPTION OF THE DRAWINGS

Several example embodiments are described with reference to the drawings, wherein like components are provided with like reference numerals. The example embodiments are intended to illustrate, but not to limit, the invention. The drawings include the following figures.

DETAILED DESCRIPTION OF THE EMBODIMENTS

Embodiments of the present application are directed to a analog front end circuit. Those of ordinary skill in the art will realize that the following detailed description of the analog front end circuit is illustrative only and is not intended to be in any way limiting. Other embodiments of the analog front end circuit will readily suggest themselves to such skilled persons having the benefit of this disclosure.

Reference will now be made in detail to implementations of the analog front end circuit as illustrated in the accompanying drawings. The same reference indicators will be used throughout the drawings and the following detailed description to refer to the same or like parts. In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Figure 6:
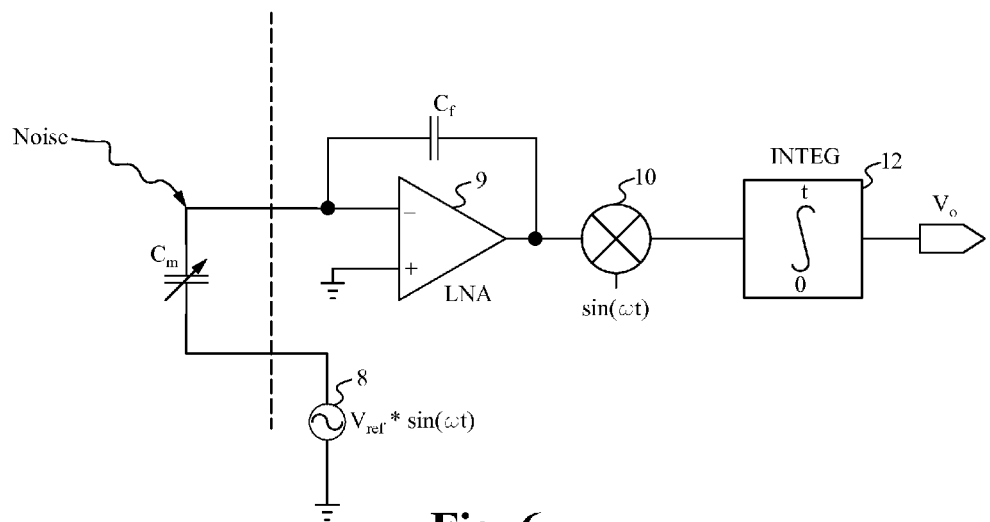
FIG. 6 illustrates a simplified schematic block diagram of an analog front end circuit using coherent detection according to a first embodiment.

In some embodiments, a capacitance measurement is performed by an analog front end circuit that uses coherent detection, also referred to as synchronous demodulation or correlation, to reject noise and/or other interferers. FIG. 6 illustrates a simplified schematic block diagram of an analog front end circuit using coherent detection according to a first embodiment. Coherent detection generally refers to transmitting a signal at a certain frequency f, and detecting the signal at that same frequency f. Signals at other frequencies are considered noise. A mixer 10 and an integrator 12 are together referred to as a correlator, which performs synchronous demodulation, or correlation, to reject noise and/or interferers. In some embodiments, a mixer includes an operational amplifier and a resistor pair including a variable resistor, where an output voltage of the mixer is a function of the input voltage multiplied by the ratio of the two resistors. In some embodiments, an integrator includes an operational amplifier, a feedback capacitor coupled to the input and output of the operational amplifier, and a resistor coupled to the input of the operational amplifier, where an output voltage of the integrator is equal to the inverse of the resistor and capacitor product multiplied by the integration of the input voltage over a period of time. Alternatively, other conventional mixer and integrator configurations can be used.

A signal generator 8 generates an excitation signal sin (ωt), where ω=2πf. The excitation signal sin (ωt) is multiplied by a reference voltage Vref. The resulting signal Vref*sin (ωt) is modulated according to a measured capacitance of the capacitor Cm. This modulated signal is amplified by a low-noise amplifier 9, input to the mixer 10 and mixed with the original excitation signal sin (ωt). The mixer 10 multiples the two input signals, the modulated and amplified excitation signal and the excitation signal. The multiplied signals are then integrated over a time period T by the integrator 12. The time period T is a multiple of the period 1/f. Multiplying the two sine wave signals results in a DC voltage term (Cm/2Cf)Vref plus a sine term at twice the frequency, which when integrated over a multiple of the frequency cancels out, leaving only the DC voltage term. This is the result when only an ideal signal is present. When noise is introduced, the noise is also multiplied by the excitation signal sin (ωt) and integrated. The output voltage Vout can be represented as follows:

$$V_{out} = \frac{C_m}{2C_f} V_{ref} + \int_0^T n(t)\sin(2\pi ft)\,dt \qquad (1)$$

where T is a multiple of 1/f and the noise is represented as n(t). The integrator 12 provides a band-pass filtering function with a peak around f so that the noise, included in the second term in equation (1), is filtered out. The output voltage Vout is the DC voltage term that can be subsequently sampled using an ADC. There is no dynamic signal to be sampled.

Figure 7:
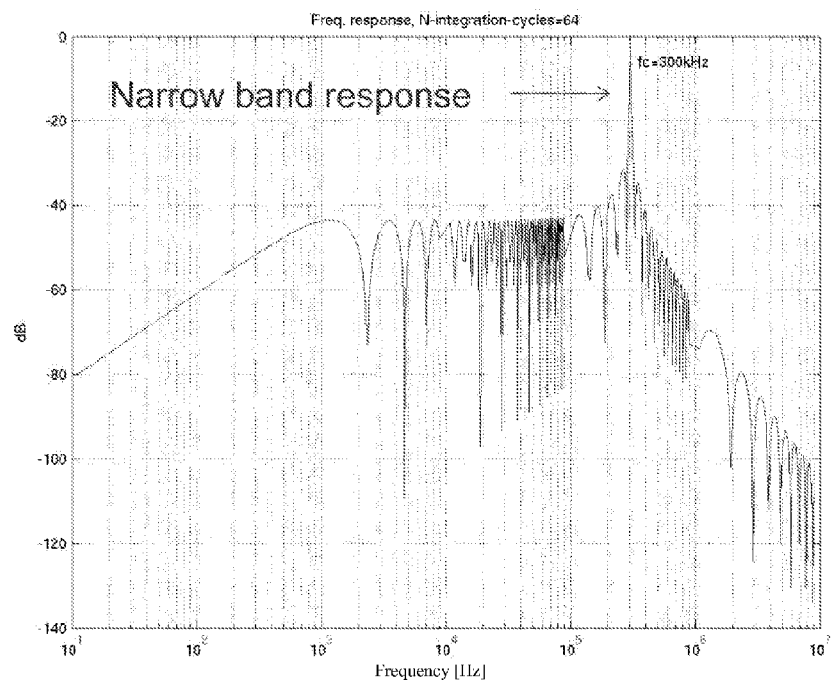
FIG. 7 illustrates an exemplary frequency response of the circuit of FIG. 6 for an excitation frequency f equal to 300 kHz.

FIG. 7 illustrates an exemplary frequency response of the circuit of FIG. 6 for an excitation frequency f equal to 300 kHz. In an exemplary application, the circuit of FIG. 6 is configured for narrow band pass filtering, and the corresponding narrow band frequency response of FIG. 7 shows that the circuit is very selective about 300 kHz. Other frequencies are filtered out.

Figure 1:
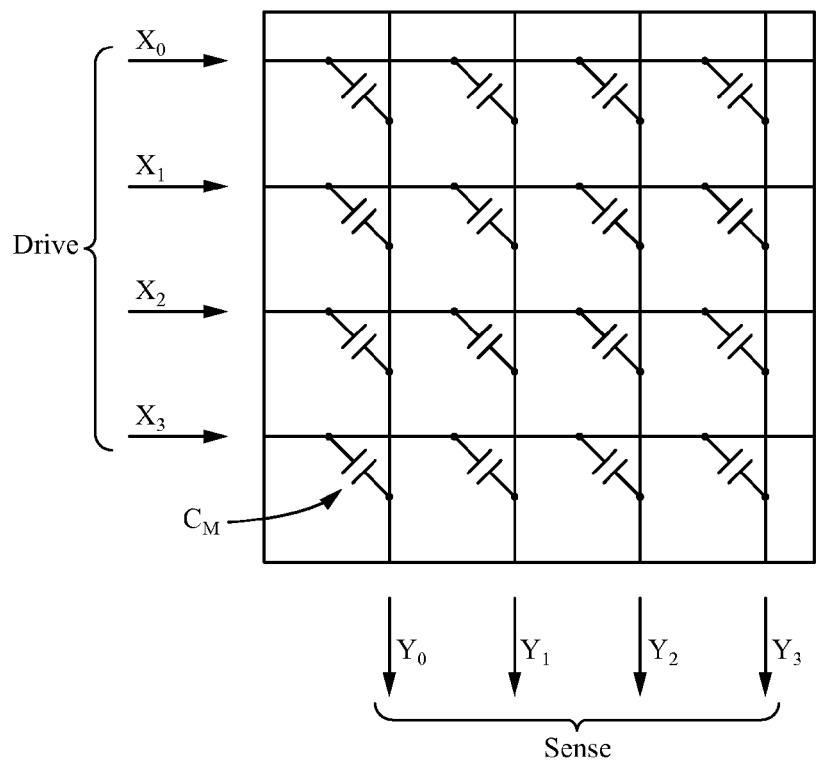
FIG. 1 illustrates an exemplary conventional capacitive touch sensor used in a capacitive touchscreen panel.
Figure 2A:
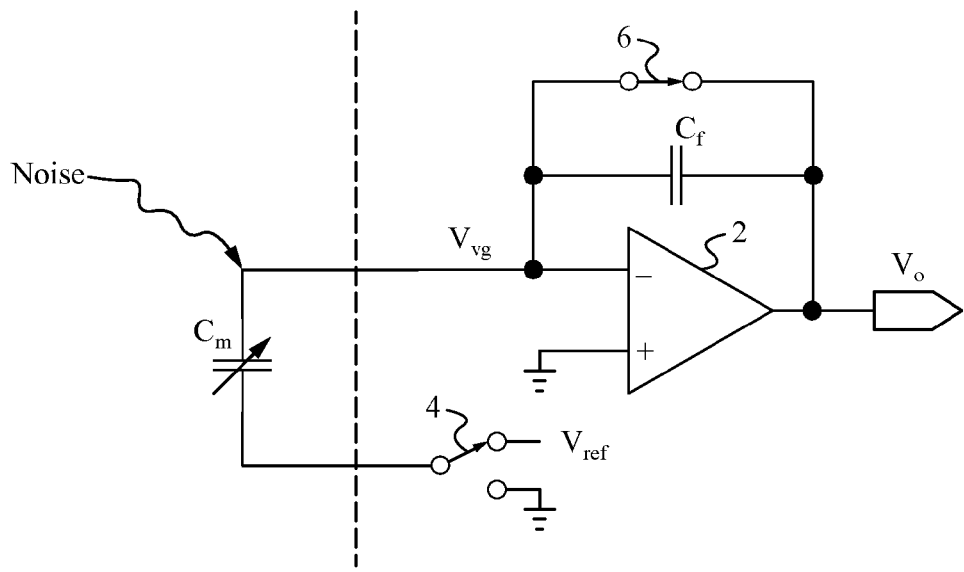
FIGS. 2A and 2B illustrate a simplified schematic block diagram of a conventional analog front end circuit used for measuring a capacitance of an external capacitor and converting the measured capacitance to a corresponding voltage.
Figure 2B:
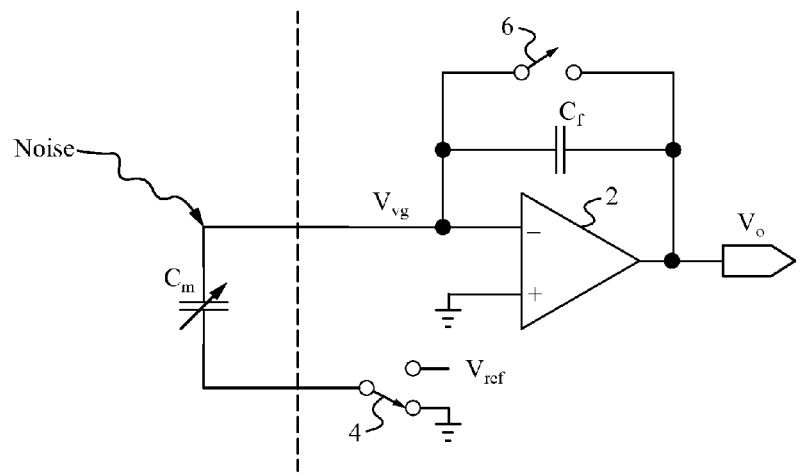
Figure 3:
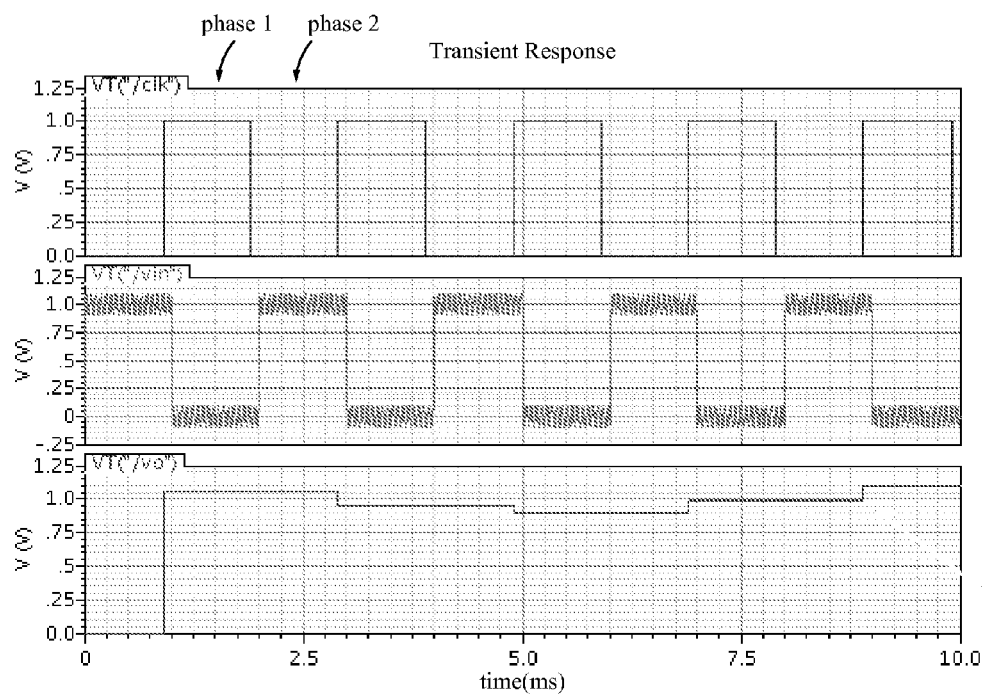
FIG. 3 illustrates exemplary response curves for the circuit of FIGS. 2A and 2B.
Figure 4:
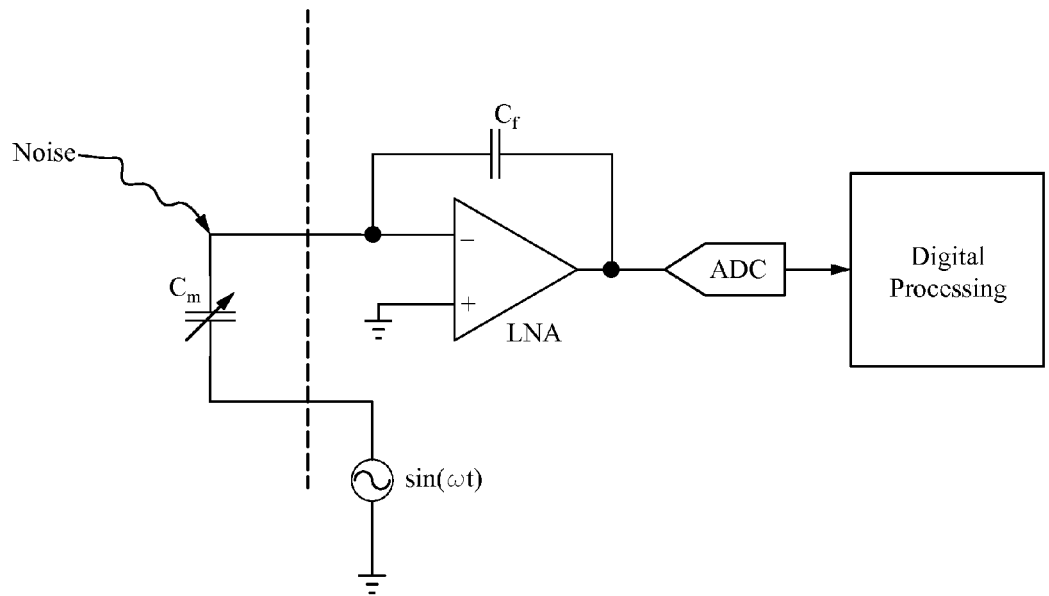
FIG. 4 illustrates a simplified schematic block diagram of a conventional analog front end circuit using digital filtering.
Figure 5:
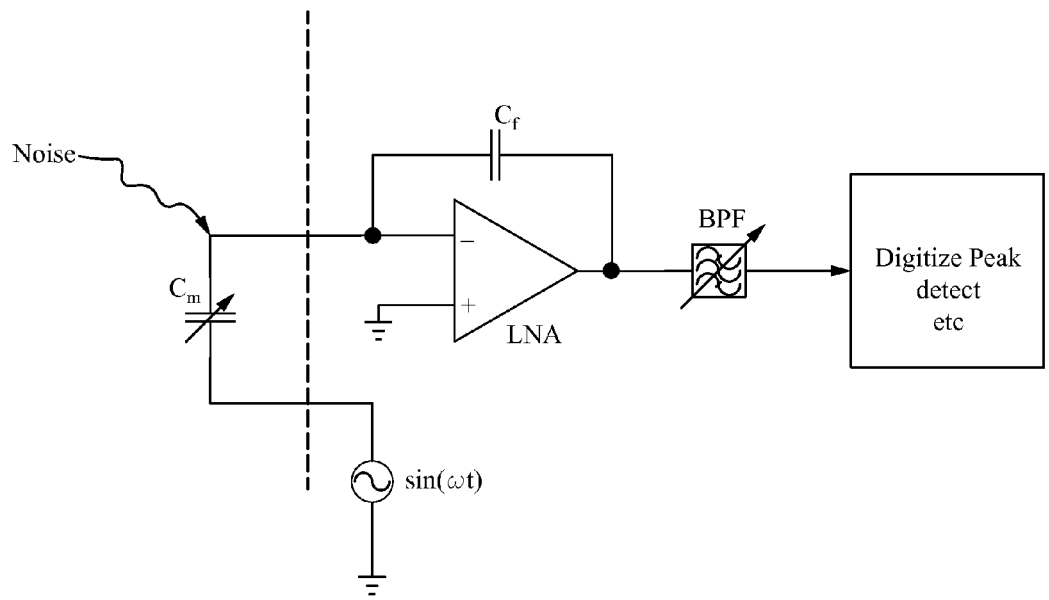
FIG. 5 illustrates a simplified schematic block diagram of another conventional analog front end circuit.

In addition to filtering out the noise, the coherent detection circuit shown in FIG. 6 can also be easily adapted to generate excitation signals of alternate frequencies so as change the band-pass function. This tuning does not require changing the LNA, the mixer 10, or the integrator 12. The signal generator 8 is simply changed to generate the excitation signal at the alternate frequency. In contrast, the BPF component in the conventional analog front end circuit in FIG. 5, e.g. the resistors and capacitors within the BPF, need to be adjusted to change the band-pass function.

Although the above application is described above in terms of sine waves, it is understood that other waveforms can be used to apply coherent detection. Equation (1) can be generalized to:

$$V_0 = \int_0^T E(t)C(t)dt + \int_0^T n(t)C(t)dt \qquad (2)$$

where E(t) is an excitation signal supplied to the capacitor Cm and C(t) is a correlation signal input to the mixer. E(t) and C(t) can be any waveform such that E(t) and C(t) are correlated. E(t) and C(t) are chosen such that the integration of E(t)C(t) is maximized and the integration of n(t)C(t) is minimized. C(t) is selected for least correlation to noise. The time period T is a multiple of the E(t)*C(t) period.

The analog front end circuit of FIG. 6 utilizes coherent detection within a capacitance measurement application. In an exemplary application, the analog front end circuit uses coherent detection to measure capacitance of a touch screen display. The analog front end circuit provides excellent noise and interference immunity, and also provides a higher signal to noise ratio.

The analog front end circuit of FIG. 6 provides a continuous time signal path, there is no discrete sampling function performed where sampling is performed and then the charge across the capacitor is discharged. The signal continuously flows through the mixer and the integrator, and because of this there is no aliasing due to time instant sampling. Anti-aliasing is done within the correlator. There is no need for a separate anti-aliasing filter.

The analog front end circuit of FIG. 6 uses less power than conventional analog front end circuits, such as the analog front end circuits of FIGS. 2A, 2B, 4, and 5. An ADC coupled to the analog front end circuit of FIG. 6 does not require as much power as an ADC, such as the ADC used in FIG. 4, that is sampling an active analog signal. The ADC coupled to the analog front end of FIG. 6 can be slower and less precise.

The present application has been described in terms of specific embodiments incorporating details to facilitate the understanding of the principles of construction and operation of the analog front end circuit. Many of the components shown and described in the various figures can be interchanged to achieve the results necessary, and this description should be read to encompass such interchange as well. As such, references herein to specific embodiments and details thereof are not intended to limit the scope of the claims appended hereto. It will be apparent to those skilled in the art that modifications can be made to the embodiments chosen for illustration without departing from the spirit and scope of the application.

What is claimed:

1. A capacitance measurement circuit comprising:
   an external capacitor; and
   a coherent detection circuit coupled to the external capacitor and configured to measure a capacitance of the external capacitor, the coherent detection circuit including a signal generator coupled to the external capacitor, a mixing circuit and an integration circuit, wherein:
   the signal generator is configured to generate an analog excitation signal having a first frequency "f";
   a modulated analog excitation signal, being the analog excitation signal modulated by a capacitance of the external capacitor, is input to a first input of the mixing circuit;
   the analog excitation signal is input to a second input of the mixing circuit, the mixing circuit being configured to multiply the modulated analog excitation signal and the analog excitation signal and to output a mixed analog signal, the mixed analog signal including a DC voltage term plus a sine term having a second frequency approximately 2f; and
   the integration circuit filters out noise by providing a band-pass filtering function with a peak around f and is configured to integrate the mixed analog signal over a discrete period of time that is a multiple of 1/f and to output a corresponding voltage output that is proportional to a capacitance value of the capacitance.

2. The capacitance measurement circuit of claim 1 wherein the coherent detection circuit further comprises an amplifier and a feedback capacitor coupled to an input and to an output of the amplifier, wherein the input of the amplifier is coupled to the external capacitor and the output of the amplifier is coupled to the mixing circuit.

3. The capacitance measurement circuit of claim 1 wherein the mixing circuit comprises a continuous time mixing circuit.

4. The capacitance measurement circuit of claim 1 wherein the integration circuit comprises a continuous time integration circuit.

5. The capacitance measurement circuit of claim 1 wherein the coherent detection circuit comprises a continuous time signal path, wherein the continuous time signal path is configured to receive a modulated analog signal from the external capacitor and convert the modulated analog signal to the corresponding voltage output.

6. The capacitance measurement circuit of claim 1 further comprising a touch screen display, wherein the touch screen display includes the external capacitor.

7. The capacitance measurement circuit of claim 1 wherein the coherent detection circuit comprises an analog synchronous demodulator.

8. A capacitance measurement circuit comprising:
a signal generator configured to generate an analog excitation signal having a first frequency "f";
a touch screen display having at least one capacitor, wherein the capacitor is configured to input the analog excitation signal and to output a modulated analog excitation signal, wherein the analog excitation signal is modulated according to a capacitance of the capacitor;
an amplifier coupled to the capacitor and a feedback capacitor coupled to an input and to an output of the amplifier, wherein the amplifier is configured to input the modulated analog excitation signal and to output an amplified modulated analog excitation signal;
a mixing circuit coupled to the amplifier and to the signal generator, wherein the mixing circuit is configured to input the amplified modulated analog excitation signal and an analog correlation signal that is correlated to the analog excitation signal, and to output a mixed analog signal, the mixed analog signal including a DC voltage term plus a sine term having a second frequency approximately 2f; and
an integration circuit coupled to the mixing circuit, wherein the integration circuit filters out noise by providing a band-pass filtering function with a peak around f and is configured to receive the mixed analog signal and to integrate the mixed analog signal over a discrete period of time that is a multiple of 1/f and to output a voltage signal, wherein the voltage signal corresponds to the capacitance value of the capacitor.

9. A method of measuring capacitance, the method comprising:
generating an analog excitation signal having a first frequency "f"; and
applying the analog excitation signal to a capacitor to be measured, wherein:
the analog excitation signal is modulated based upon a capacitance of the capacitor; and multiplying, via a mixing circuit, the modulated analog excitation signal by the analog excitation signal to generate a mixed signal, the mixed signal including a DC voltage term plus a sine term having a second frequency approximately 2f; and
integrating the mixed signal, via an integrating circuit that filters out noise by providing a band-pass filtering function with a peak around f, and is configured to integrate the mixed analog signal over a discrete period of time that is a multiple of 1/f to generate an output voltage corresponding to the capacitance of the capacitor.

10. The method of claim 9 wherein the output voltage comprises a DC voltage.

11. The method of claim 9 wherein integrating the mixed signal filters noise and interference from the modulated analog excitation signal.

12. The method of claim 9 wherein the capacitance is a capacitance of a touch screen display.

* * * * *